(12) United States Patent
Popeck et al.

(10) Patent No.: US 10,293,465 B2
(45) Date of Patent: May 21, 2019

(54) EQUIPMENT FOR REMOVING PROTECTIVE COATINGS FROM SUBSTRATES

(71) Applicant: HZO, Inc., Draper, UT (US)

(72) Inventors: Heidi L. Popeck, Herriman, UT (US); Caleb Edward Kanavel, Sandy, UT (US); Samuel R. Anderson, Salt Lake City, UT (US); Tyler Christensen Child, South Jordan, UT (US); Daniel J. Triplett, Providence, UT (US)

(73) Assignee: HZO, INC., Draper, UT (US)

( * ) Notice: Subject to any disclaimer, the term of this patent is extended or adjusted under 35 U.S.C. 154(b) by 598 days.

(21) Appl. No.: 14/841,596

(22) Filed: Aug. 31, 2015

(65) Prior Publication Data

US 2016/0184964 A1 Jun. 30, 2016

Related U.S. Application Data

(60) Provisional application No. 62/044,013, filed on Aug. 29, 2014, provisional application No. 62/044,097, filed on Aug. 29, 2014.

(51) Int. Cl.
*B24C 1/04* (2006.01)
*B24C 1/00* (2006.01)
(Continued)

(52) U.S. Cl.
CPC ............. *B24C 1/003* (2013.01); *B24C 1/04* (2013.01); *B24C 1/086* (2013.01); *H01L 21/67069* (2013.01)

(58) Field of Classification Search
CPC .. B24C 1/00; B24C 1/003; B24C 1/04; B24C 1/086
(Continued)

(56) References Cited

U.S. PATENT DOCUMENTS 4,321,738 A * 3/1982 Makhijani ........... H01L 21/4864
228/162
5,203,794 A * 4/1993 Stratford ................. B24C 1/003
451/39
(Continued)

FOREIGN PATENT DOCUMENTS

| EP | 1317995 A1 | 6/2003 |
| GB | 2446056 A | 7/2008 |
| WO | 2014/110039 A2 | 7/2014 |

OTHER PUBLICATIONS

Thomas "PCT International Search Report for PCT/US15/47832" dated Jan. 14, 2016, 4 pages.
(Continued)

Primary Examiner — Eileen P Morgan
(74) Attorney, Agent, or Firm — Jeff Holman

(57) ABSTRACT

Apparatuses and systems that enable selective removal of protective coatings from substrates are disclosed. Such a material removal system may use pressurized solid carbon dioxide ($CO_2$) (i.e., dry ice) to remove a selected portion of a protective coating from a substrate. The material removal system may include one or more templates that provide selectivity in removing protective coatings from one or more substrates, fixtures for holding one or more substrates in place while material removal processes occur and apparatuses for positioning one or more substrates at desired locations in material removal systems.

3 Claims, 4 Drawing Sheets

(51) Int. Cl.
*B24C 1/08* (2006.01)
*H01L 21/67* (2006.01)

(58) Field of Classification Search
USPC .................................................. 451/29, 40
See application file for complete search history.

(56) References Cited

U.S. PATENT DOCUMENTS

| | | | | |
|---|---|---|---|---|
| 5,209,028 | A * | 5/1993 | McDermott | B08B 7/0092 134/7 |
| 6,805,137 | B2 * | 10/2004 | Bailey | B08B 7/00 134/1.2 |
| 8,967,078 | B2 * | 3/2015 | Soucy | B24B 31/00 118/504 |
| 9,656,350 | B2 * | 5/2017 | Astle | C23C 14/042 |
| 2003/0027495 | A1 * | 2/2003 | Shaw | B24C 1/04 451/29 |
| 2007/0128987 | A1 * | 6/2007 | Okada | B24C 1/02 451/29 |
| 2009/0126760 | A1 * | 5/2009 | Banerjee | B08B 3/02 134/1 |
| 2009/0163115 | A1 * | 6/2009 | Vyas | B24C 1/04 451/31 |
| 2011/0312252 | A1 * | 12/2011 | Pei | B24C 1/04 451/38 |
| 2012/0094581 | A1 * | 4/2012 | Sharma | B24C 1/003 451/38 |
| 2013/0040538 | A1 | 2/2013 | Scrivani et al. | |
| 2014/0190931 | A1 * | 7/2014 | Astle | C23C 14/042 216/13 |
| 2015/0118942 | A1 * | 4/2015 | Hashish | B24C 3/06 451/80 |
| 2015/0224627 | A1 * | 8/2015 | Arai | C23C 14/564 134/7 |
| 2017/0140951 | A1 * | 5/2017 | Lee | B08B 5/023 |

OTHER PUBLICATIONS

Wittmann-Regis "International Preliminary Report on Patentability" dated Feb. 28, 2017, 6 pages.

* cited by examiner

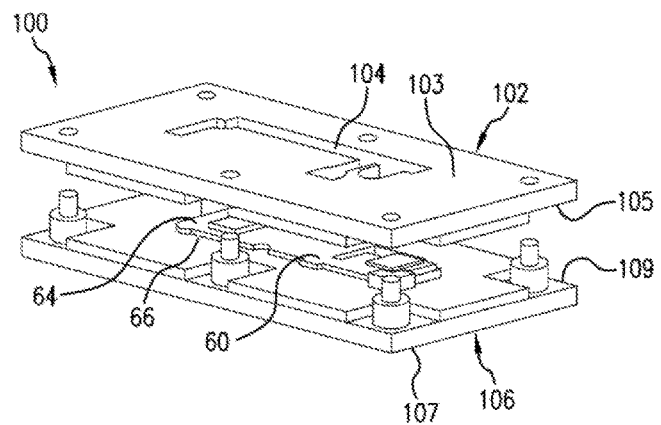
FIG.4A
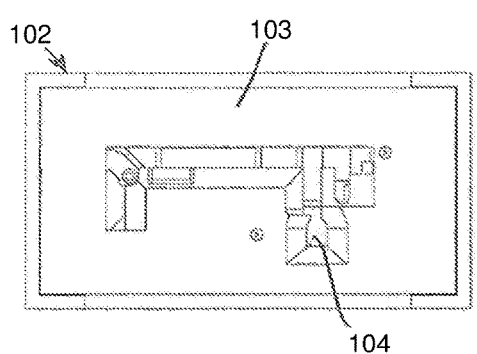
FIG. 4B
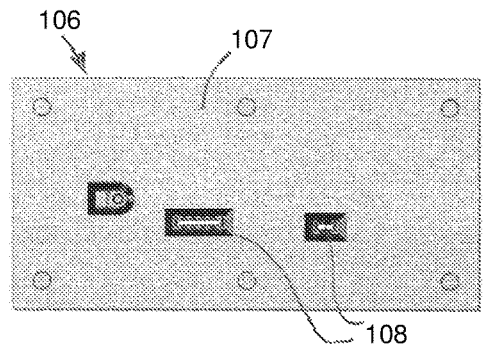
FIG. 4C
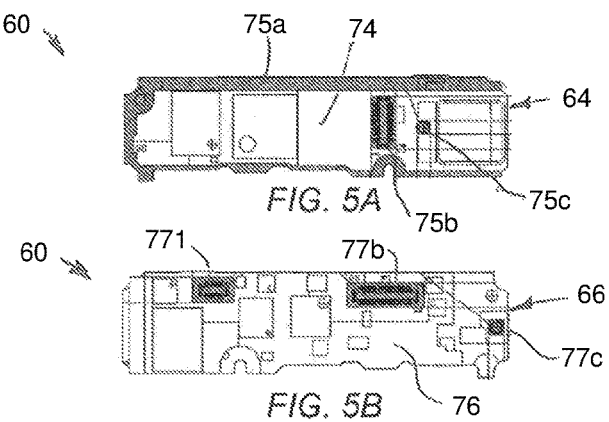
FIG. 5A
FIG. 5B

EQUIPMENT FOR REMOVING PROTECTIVE COATINGS FROM SUBSTRATES

CROSS-REFERENCE TO RELATED APPLICATIONS

Claims to the benefit of the Aug. 29, 2014, filing date of U.S. Provisional Patent Application 62/044,013, titled MULTI-AXIS PLATFORM FOR USE WITH A MATERIAL REMOVAL APPARATUS ("the '013 Provisional Application"), and the Aug. 29, 2014, filing date of U.S. Provisional Patent Application 62/044,097, titled HOLD-DOWN FIXTURE FOR USE IN REMOVING A PROTECTIVE COATING FROM SELECTED AREAS OF A SUBSTRATE ("the '097 Provisional Application"), are hereby made pursuant to 35 U.S.C. § 119(e). The entire disclosures of the '013 Provisional Application and the '097 Provisional Application are hereby incorporated by reference.

TECHNICAL FIELD

This disclosure relates generally to apparatuses and systems that enable selective removal of protective coatings from substrates. In some embodiments, the material removal apparatuses or systems may comprise dry ice blasting systems, which are direct pressurized solid carbon dioxide ($CO_2$) (i.e., dry ice) toward a protective coating on a substrate. More specifically, this disclosure relates to apparatuses that are configured to facilitate the removal of selected portions of protective coatings from one or more substrates, including dry ice blasting systems, templates that provide selectivity in removing protective coatings from one or more substrates, fixtures for holding one or more substrates in place while material removal processes occur and apparatuses for positioning one or more substrates at desired locations in material removal systems.

SUMMARY

Material removal apparatuses and systems may be used to remove portions of a material from a substrate. Some material removal apparatuses and systems may be configured to selectively remove material from substrates. In a particular implementation, material removal apparatuses and systems may be used to selectively remove portions of protective coatings (e.g., moisture-resistant coatings, such as parylene coatings) from substrates, including, but not limited to, subassemblies and assemblies of electronic devices (e.g., portable electronic devices, wearable electronic devices and other wearable devices, electronic devices that are expected to be exposed to the elements and medical devices). So-called "dry ice blasting" processes, equipment and systems have been found to be particularly effective for selectively removing protective coatings from substrates.

Dry ice blasting may be used to remove a protective coating without leaving any chemical residue, as dry ice sublimates (i.e., vaporizes from a solid to a gas) at room temperature, and without generating any secondary waste material. Dry ice blasting systems accelerate particles or pellets of dry ice with pressurized air or a pressurized gas. A dry ice blasting system may pressurize the dry ice and direct it toward a substrate as a stream or jet or as a curtain or sheet. The location of the stream or jet or the curtain or sheet may remain stationary as the dry ice blasting equipment operates. In embodiments where the impact area of the dry ice will not simultaneously cover all of the areas of a substrate from which one or more portions of a protective coating is to be removed, a nozzle from which the dry ice is ejected and/or the substrate may be moved laterally (i.e., along and x-axis and a y-axis) to enable the dry ice to contact all of the areas of a protective coating that are to be removed. In some embodiments, it may also be desirable to select the spacing between the nozzle and the substrate (i.e., along a z-axis).

In one aspect, this disclosure relates to dry ice blasting systems with chambers that are configured to receive one or more substrates and within which dry ice, under pressure, may be directed toward the substrate(s).

In another aspect, platforms are disclosed that are configured to be placed in and, optionally, removed from the chambers of dry ice blasting systems and to move one or more substrates relative to pressurized dry ice. Such a platform may include a support and an actuator. The support may be configured to receive and, optionally, engage one or more substrates, and to hold each substrate supported thereby in place as pressurized dry ice is directed onto that substrate. The actuator may be configured to move the support along at least one axis relative to (e.g., under) the pressurized dry ice. In some embodiments, the actuator may be configured to move the support and any substrates carried thereby along two or more axes, such as the x-axis and the y-axis of a chamber of dry ice blasting equipment. The actuator may also be configured to move the support and any substrates carried thereby along a z-axis (i.e., toward and away from a head from which the pressurized dry ice is expelled).

As an alternative to the use of a movable platform in a chamber of a dry ice blasting system, the nozzle(s) of the dry ice blasting system, from which dry ice is ejected, may be configured to move in multiple axes (e.g., x-axis, y-axis and/or z-axis) relative to a fixed location, or platen of the dry ice blasting system, which platen is configured to hold one or more substrates from which a protective coating may be removed.

In some embodiments, a movable nozzle and a movable platform may be used in conjunction with one another to hold and selectively remove protective coatings from one or more substrates. Both the nozzle and the platform may move in one or more common directions (e.g., x-axis, y-axis and/or z-axis) or the nozzle may move in some directions (e.g., z-axis) while the platform moves in different directions (e.g., x-axis and y-axis).

In another aspect, this disclosure relates to templates that may be used to facilitate the removal of portions of a protective coating from selected locations of a substrate. Such a template may be configured for assembly with at least one surface or side of a substrate, such as an electronic device (e.g., an electronic component, an electronic subassembly or an electronic assembly). The template may seal against the surface against which it is assembled, and each portion of the protective coating that is to be removed from the substrate may be exposed through a corresponding aperture of the template.

Fixtures for holding one or more substrates in place during dry ice blasting or other material removal processes are also disclosed. Such a fixture may be configured to receive one or more substrates and to position the one or more substrates in desired orientations. The fixture and the substrate(s) may then be received by a platen or a support plate of a material removal system and, along with the platen or the support plate, position each substrate in a desired orientation relative to a material removal component of the material removal system (e.g., a nozzle of a dry ice blasting system). As an alternative to directly receiving a substrate, each receptacle of a fixture may be configured to receive one or more templates that have been assembled with a substrate.

Another aspect of this disclosure relates to methods for removing protective coatings or other materials from substrates using any combination of apparatuses of this disclosure. Such a method may include assembling at least one template with at least one substrate, placing each substrate on a platen or a support plate, securing each substrate in place on the platen or the support plate, adjusting positions of a nozzle of a dry ice blasting system and each substrate relative to one another and/or directing pressurized dry ice toward each substrate. The template and/or selective movement of the platen/support plate and/or the nozzle may sequentially expose a plurality of different areas of a protective coating on a substrate to the pressurized dry ice and enable the pressurized dry ice to remove selected portions of the protective coating from each substrate.

Other aspects, as well as features and advantages, of the disclosed subject matter will be apparent to those of ordinary skill in the art through consideration of the ensuing description, the accompanying drawings and the appended claims.

BRIEF DESCRIPTION OF THE DRAWINGS

In the drawings:

FIGS. 4A-4C show an embodiment of a template that may be used to hold an embodiment of a substrate and to expose selected regions on at least one side of the substrate to dry ice blasting processes, such as those effected by way of an embodiment of a dry ice blasting system according to this disclosure;

FIGS. 5A and 5B show an embodiment of a substrate from which selected portions of a protective coating have been removed using a dry ice blasting process and the embodiment of template shown in FIGS. 4A-4C.

DETAILED DESCRIPTION

Figure 1:
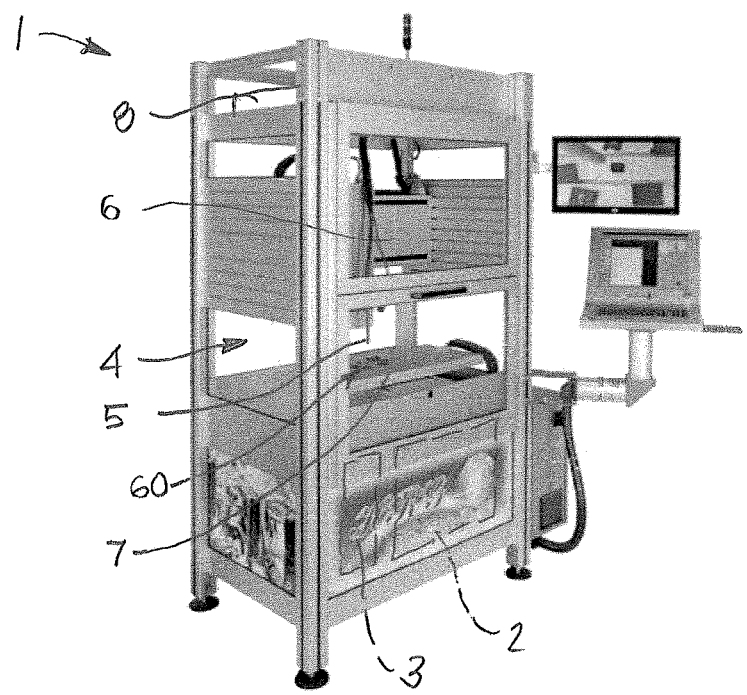
FIG. 1 illustrates an embodiment of a dry ice blasting system.

FIG. 1 illustrates an embodiment of a dry ice blasting system 1. The dry ice blasting system 1 may be used to selectively remove portions of a protective coating (e.g., a parylene coating or a coating that includes multiple layers formed by atomic layer deposition (ALD) processes) from a substrate (e.g., an electronic device assembly). When dry ice blasting processes are used, removal of selected portions of a protective coating may occur with no chemical residue, as dry ice sublimates to gaseous carbon dioxide ($CO_2$) at room temperature, and without generating any secondary waste material other than the material that has been removed from the substrate, as dry ice and $CO_2$ are generally considered to be non-toxic.

In the depicted embodiment, the dry ice blasting system 1 includes dry ice supply 2, a pressurization component 3, a chamber 4, a nozzle 5 and a platen 7. The pressurization component 3 is associated with the dry ice supply 2 in a manner that retrieves dry ice from the dry ice supply 2 and conveys the dry ice under pressure to the nozzle 5, which is located within the chamber 4. At the nozzle 5, the pressurized dry ice is directed toward the platen 7 and any substrates 60 that are carried by the platen 7.

The dry ice supply 2 may store dry ice in any suitable form, for example, as a block, as pellets or as particles. The pressurization component 3, which may be part of the dry ice supply 2 or associated with the dry ice supply 2, may employ pressurized air or a pressurized gas to accelerate the particles or pellets of dry ice. The pressurization component 3 may be configured to operate for a sufficient duration of time to remove a desired amount of protective material of the protective coating from a substrate (e.g., partially remove the protective material to thin the protective coating at one or more selected regions and/or completely remove the protective material from one or more selected regions of the protective coating).

The nozzle 5 of the dry ice blasting system 1 may be configured to direct the dry ice toward the platen 7 or toward a substrate carried by the platen 7, and to define the shape of an area the dry ice impacts on the platen 7 or on a substrate (not shown) carried by the platen 7. In some embodiments, the nozzle 5 may be configured to emit a narrow stream, or jet, of dry ice (e.g., a stream having a width of about 3 mm or less, a stream having a width of about 2 mm or less, a stream having a width of about 1 mm or less or a stream having a width of about 0.5 mm less). The stream may have any desired cross-sectional shape and, thus, impact an area having any desired shape (e.g., circular, oval, rectangular, square or triangular). In other embodiments, the nozzle 5 may be configured to eject a curtain or sheet of dry ice. In a specific embodiment, the fan nozzle 5 may comprise a fan nozzle with a 1.6 mm×20 mm opening. Such a curtain or sheet of dry ice may have any desired width (e.g., about 2 mm wide or less, about 1.5 mm wide or less, about 1 mm wide or less or about 0.5 mm wide or less) and any desired length (e.g., about 5 mm, about 1 cm, about 2 cm, about 5 cm or about 10 cm).

The dry ice blasting system 1 may include a gantry 6 that carries the nozzle 5 and determines a lateral (i.e., x-axis, y-axis, or X-Y) and/or vertical (i.e., z-axis, or Z) position of the nozzle 5 within the chamber 4 and over the platen 7. Any suitable configuration of gantry 6 may be employed in the dry ice blasting system 1.

Optionally, the dry ice blasting system 1 may include an exhaust system 8. The exhaust system 8 may be associated with an interior of the chamber 4 in a manner that enables carbon dioxide ($CO_2$) to be drawn from the interior of the chamber 4 and conveyed to another location (e.g., to the atmosphere or to a storage/waste container).

The platen 7 may include positioning elements that ensure that a particular substrate (e.g., a subassembly of an electronic device) is positioned in a desired orientation and/or that secure the substrate in the desired orientation. As an alternative to including such positioning elements, the platen 7 may be configured to receive separate positioning elements.

The platen 7 of a dry ice blasting system 1 may be configured to be move in a variety of directions within the interior of the chamber 4. Without limitation, the platen 7 may be configured to be raised and lowered (i.e., to move along a z-axis). The platen 7 may be configured to move laterally, for example, from side to side (i.e., along an x-axis) and/or from front to back (i.e., along a y-axis). Alternatively, a position of the platen 7 within the chamber 4 of a dry ice blasting system 1 may be fixed.

Figure 2:
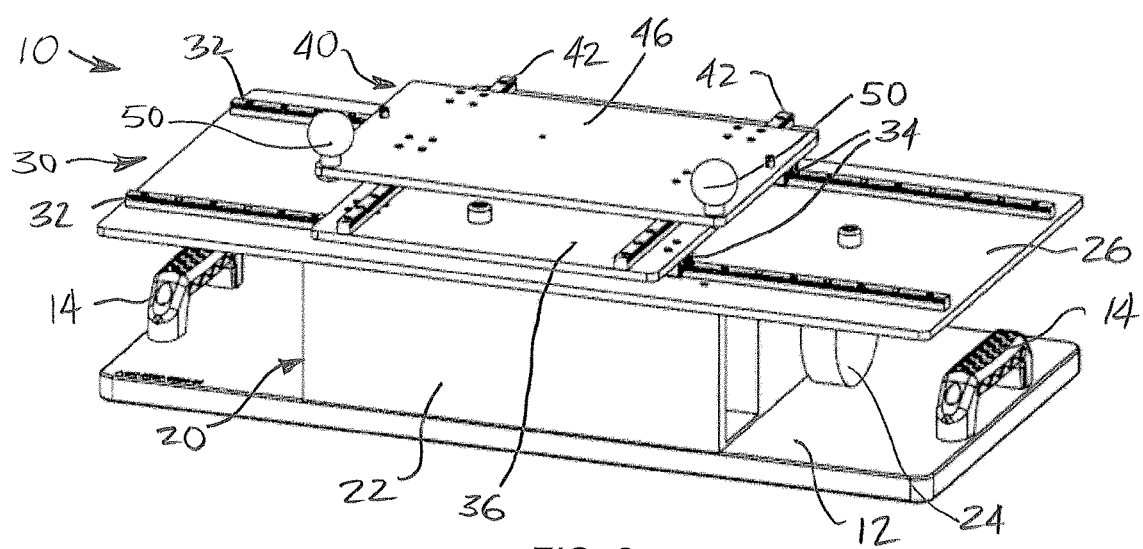
FIG. 2 depicts an embodiment of a movable platform that may be used with various embodiments of dry ice blasting systems, including, but not limited to, the embodiment depicted by FIG. 1.
Figure 3:
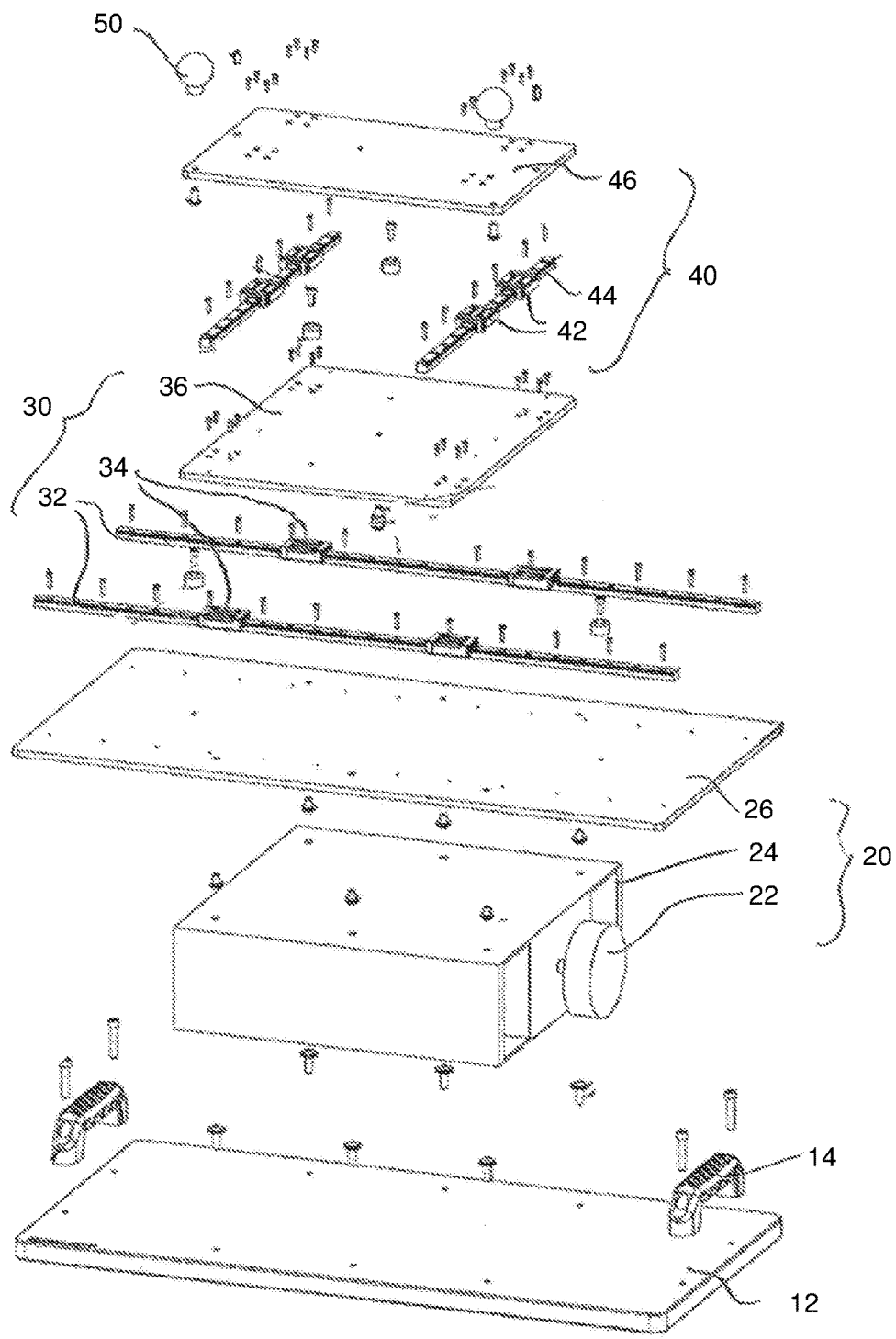
FIG. 3 provides an exploded view of the embodiment of movable platform shown in FIG. 2.

A platen 7 of a dry ice blasting system 1 may be configured to receive a moveable platform 10, such as that depicted by FIG. 2 (in assembled form) and FIG. 3 (in exploded form). The movable platform 10 may be secured to the platen 7 in any suitable manner (e.g., with features that mutually engage features of the platen 7, with intermediate engagement features that are configured to be assembled between the platen 7 and the moveable platform 10 or by way of an interference fit between corresponding features of the platen 7 and the moveable platform 10). A moveable platform 10 may be configured to enable movement of one or more substrates laterally (i.e., side-to-side, or along an x-axis, and front-to-back, or along a y-axis). A movable platform 10 may also be configured to move one or more substrates vertically (i.e., up and down, or along a z-axis).

The embodiment of movable platform 10 depicted by FIGS. 2 and 3 includes a base plate 12, a z-movement system 20, an x-movement system 30, a y-movement system 40 and a support plate 46. Such a moveable platform 10 may enable movement of a substrate within a dry ice blasting system 1 (FIG. 1) (e.g., a manually operable dry ice blasting system 1 or an automated dry ice blasting system 1) or within any other embodiment of material removal system to enable removal of a material, such as a protective coating, from selected locations of the substrate.

The base plate 12 of the movable platform 10 may be configured for placement on the platen 7 (FIG. 1) of a dry ice blasting system 1 (FIG. 1). The base plate 12 and the platen 7 may include complementarily configured features, which may ensure that the base plate 12 is properly positioned, or aligned, on the platen 7 and/or that the base plate 12 is secured to the platen 7. In some embodiments, these complementarily configured features may be carried by and/or formed in surfaces of the base plate 12 and the platen 7 that are configured to oppose, or face, one another.

The base plate 12 may include one or more handles 14, with two handles 14 being shown in the embodiment of dry ice blasting system 1 depicted by FIGS. 2 and 3). The handles 14 may facilitate placement of the movable platform 10 within the chamber 4 (FIG. 1) of a dry ice blasting system 1 (FIG. 1) and on the platen 7 (FIG. 1) of the dry ice blasting system 1, as well as removal of the movable platform 10 from the platen 7 and the chamber 4.

In embodiments where the movable platform 10 includes a z-movement system 20, the z-movement system 20 may be secured to the base plate 12 of the movable platform 10. While the z-movement system 20 may have any of a variety of suitable configurations, FIGS. 2 and 3 depict an embodiment in which the z-axis system 20 includes a stand 22 and a support plate 26. The stand 22 includes at least one actuator 24 (e.g., a manually operable dial or one or more suitable motors and associated controls) that is configured to raise and lower the support plate 26.

In embodiments where the movable platform 10 includes an x-movement system 30, the x-movement system 30 may be secured to the support plate 26 of a z-movement system 20 or, if the movable platform 10 does not include a z-movement system 20, to the base plate 12 of the movable platform 10. An x-movement system 30 may include one or more elements that facilitate side-to-side movement, such as the rails 32 and sliders 34 depicted by FIGS. 2 and 3. Each rail 32 may be oriented to extend from a location on one side of the base plate 12 and, thus, of the movable platform 10 to a location on an opposite side of the base plate 12 and the moveable platform 10. Each slider 34 may be configured to engage a rail 32 and to move along a length of the rail 32, in some embodiments with little or no friction. The sliders 34 may be secured to a bottom surface of a support plate 36 of the x-movement system 30 to enable the support plate 36 to move along the lengths of the rails 32 and, thus, from side-to-side relative to the base plate 12 and the remainder of the movable platform 10.

In embodiments where the movable platform 10 includes a y-movement system 40, as illustrated, the y-movement system 40 may be secured to the support plate 36 of an x-movement system 30. If the movable platform 10 lacks an x-movement system 30 but includes a z-movement system 20, the y-movement system 40 may be secured to the support plate 26 of the z-movement system 20. If the movable platform 10 lacks both an x-movement system 30 and a z-movement system 20, the y-movement system 40 may be secured to the base plate 12 of the movable platform 10. In any of these embodiments, the y-movement system 40 may include one or more elements that facilitate front-to-back movement, such as the rails 42 and sliders 44 depicted by FIGS. 2 and 3. Each rail 42 may be oriented to extend from a location at or near a front the base plate 12 and, thus, of the movable platform 10 to a location at or near a rear of the base plate 12 and the moveable platform 10. Each slider 44 may be configured to engage a rail 42 and to move along a length of the rail 42, in some embodiments with little or no friction. The sliders 44 may be secured to a bottom surface of a support plate 46 of the y-movement system 40 to enable the support plate 46 to move along the lengths of the rails 42 and, thus, from front-to-back relative to the base plate 12 and the remainder of the movable platform 10.

The uppermost support plate 26, 36, 46 of the movable platform 10 may be configured to receive one or more substrates (not shown) that are to be processed by a dry ice blasting system 1 (FIG. 1). In the depicted embodiment, support plate 46 is the uppermost support plate. In some embodiments, the uppermost support plate 46 may include or be configured to receive one or more elements that position each substrate in a desired orientation and/or secure each substrate to an upper surface of the support plate 46.

As illustrated by FIGS. 2 and 3, in some embodiments, a movable platform 10 may include one or more actuation elements 50. Each actuation element 50 may be configured to cause the uppermost support plate (i.e., support plate 46 in the depicted embodiment) to move in one or more desired directions. In the illustrated embodiment, each actuation element 50 may comprise a handle, which may be manually grasped to enable manipulation of the lateral (i.e., x-axis and/or y-axis) positions of the support plate 46 and any substrates carried by the support plate 46. In other embodiments, the actuation element 50 may enable automated movement of the support plate 46 (e.g., by way of one or more motors and controls associated with the motor(s)).

In addition to showing the primary elements of an embodiment of a movable platform, FIG. 3 shows a specific, but non-limiting, embodiment in which those elements may be secured to one another. Specifically, FIG. 3 illustrates the use of screws to secure the various elements to one another in intended arrangements. Other options for securing various elements of a moveable platform 10 to one another include the use of rivets, welds, brazing, adhesive materials, press fits, interferences fits and the like.

In addition to enabling movement of one or more substrates (not shown) within the chamber 4 (FIG. 1) of a dry ice blasting system 1 (FIG. 1), the movable platform 10 may simplify the process of arranging the one or more substrates over the platen 7 of a dry ice blasting system 1. Since the movable platform 10 is configured to be removed from the chamber 4 (FIG. 1) of the dry ice blasting system 1, one or more substrates may be placed on an uppermost support plate 46 of the movable platform 10 without the impediments that would otherwise be presented by various features defining the chamber 4 of the dry ice blasting system 1. With each substrate in place upon the uppermost support plate 46, the movable platform 10 may then be placed into the chamber 4, and the substrate(s) may then be subjected to dry ice blasting.

As an alternative to placing one or more substrates directly on the platen 7 (FIG. 1) of a dry ice blasting system 1 (FIG. 1) or directly on the uppermost support plate 46, of a movable platform 10 (FIGS. 2 and 3) that is configured to be introduced into the chamber 4 (FIG. 1) of a dry ice blasting system 1 and onto the platen 7 of the dry ice blasting system 1, the one or more substrates 60 may be secured to a template 100, as illustrated by FIGS. 4A-4C. The template 100 may then be secured to the platen 7 or the uppermost support plate 46.

FIGS. 4A-4C illustrate an embodiment of a template 100 that has been assembled with a substrate 60. The substrate 60 may comprise a subassembly of an electronic device or an assembly of an electronic device, both of which may be referred to herein as an "electronic device assembly." In the illustrated embodiment, the substrate 60 comprises a printed circuit board (PCB), although a template 100 according to this disclosure may be configured to receive any of a variety of different types of electronic devices (e.g., electronic device assemblies that include flexible circuit boards (FCBs), frames or housing elements), as well as a variety of other types of substrates 60.

The material(s) from which the elements 102 and 106 of a template 100 are made may withstand material removal processes without suffering from undesired degradation. Without limitation, the elements 102 and 106 may be made from a suitable metal (e.g., aluminum, stainless steel or steel), a resin or a rigid thermoplastic material. While the elements 102 and 106 may have any suitable configuration, as shown in FIGS. 4A-4C, they may be generally flat.

When the elements 102 and 106 of such an embodiment of template 100 are assembled with a substrate and the elements 102 and 106 are assembled with each other, the substrate 60 may be sandwiched and held in place between the elements 102 and 106. The elements 102 and 106 may be secured to each other in any suitable manner. Without limitation, corresponding features of the elements 102 and 106 may engage each other in an interference fit or a snap-fit as the elements 102 and 106 are properly assembled with each other.

While the template 100 shown in FIGS. 4A-4C includes two elements 102 and 106—a top element and a bottom element, templates that only include one element (e.g., a top element or a bottom element) are also within the scope of this disclosure. As shown by FIG. 4A, a first element 102 of the template 100 is configured for assembly over a first side 64 of a substrate 60 and a second element 106 of the template 100 is configured to be assembled over a second side 66 of the substrate 60. Inner surfaces 105 and 109 of the elements 102 and 106 of the template 100 are respectively configured to be placed against the first side 64 and the second side 66 of the substrate 60.

FIGS. 4B and 4C respectively show views of the outer surfaces 103 and 107 of the elements 102 and 106, to which apertures 104 and 108 open. The apertures 104 and 108 are configured to be positioned over parts of a protective coating that are to be removed from the substrate 60. Thus, as dry ice is directed into one or more of the apertures 104, 108, protective material may be removed from portions of the protective coating that are exposed through each aperture 104, 108. Accordingly, a template 100 that includes elements 102 and 106 with apertures 104 and 108, respectively, that are configured to be positioned over opposite sides 64 and 66 of a substrate 60 may be configured to be positioned in an upright orientation and an inverted orientation to enable the selective removal of portions of a protective coating from each side 64, 66 of the substrate 60.

In some embodiments, the inner surfaces 105 and 109 of the elements 102 and 106 of the template 100 may be at least partially lined with a material that will seal against the sides 64 and 66 of the substrate 60. A seal may also protect the substrate 60 from damage that might otherwise be cause by vibration of the template 100 and/or the substrate 60 as material is removed from the substrate 60. In more specific embodiments, the seal(s) on the inner surface 105, 109 of an element 102, 106 of the template 100 may comprise a foam material (e.g., polystyrene foam or polyurethane foam) carried by the inner surface 105, 109. The seal(s) may prevent movement of each substrate 60 relative to an element 102, 106 of the template 100, prevent dry ice from reaching one or more locations on a side 64, 66 of the substrate 60 on which a protective coating is to remain and/or prevent damage to the substrate 60 or to regions of a protective coating that are to remain intact on the substrate 60.

In FIGS. 5A and 5B, the substrate 60 is shown after a portion of a protective coating 74, 76 has been removed from each side 64, 66 of the substrate 60. More specifically, FIGS. 5A and 5B show that features and/or components 75a, 75b, etc.; 77a, 77b, etc., of the substrate 60 have been exposed through the protective coating 74, 76 on each side of the substrate 60. As indicated previously herein, the depicted embodiment of substrate 60 comprises a flexible circuit board. As shown in FIG. 5A, on side 64, portions of a protective coating 74 that were located over a ground trace 75a, a board-to-board connector 75b (e.g., a plug-in type connector or a zero insertion force (ZIF) connector) and a wireless connector 75c (e.g., a radiofrequency connector or a BLUETOOTH® connector) have been removed to expose these features and/or components. In FIG. 5B, which shows side 66 of the substrate 60, a two board-to-board connectors 77a and 77b and a wireless connector 77c have been exposed through protective coating 76.

Figure 6:
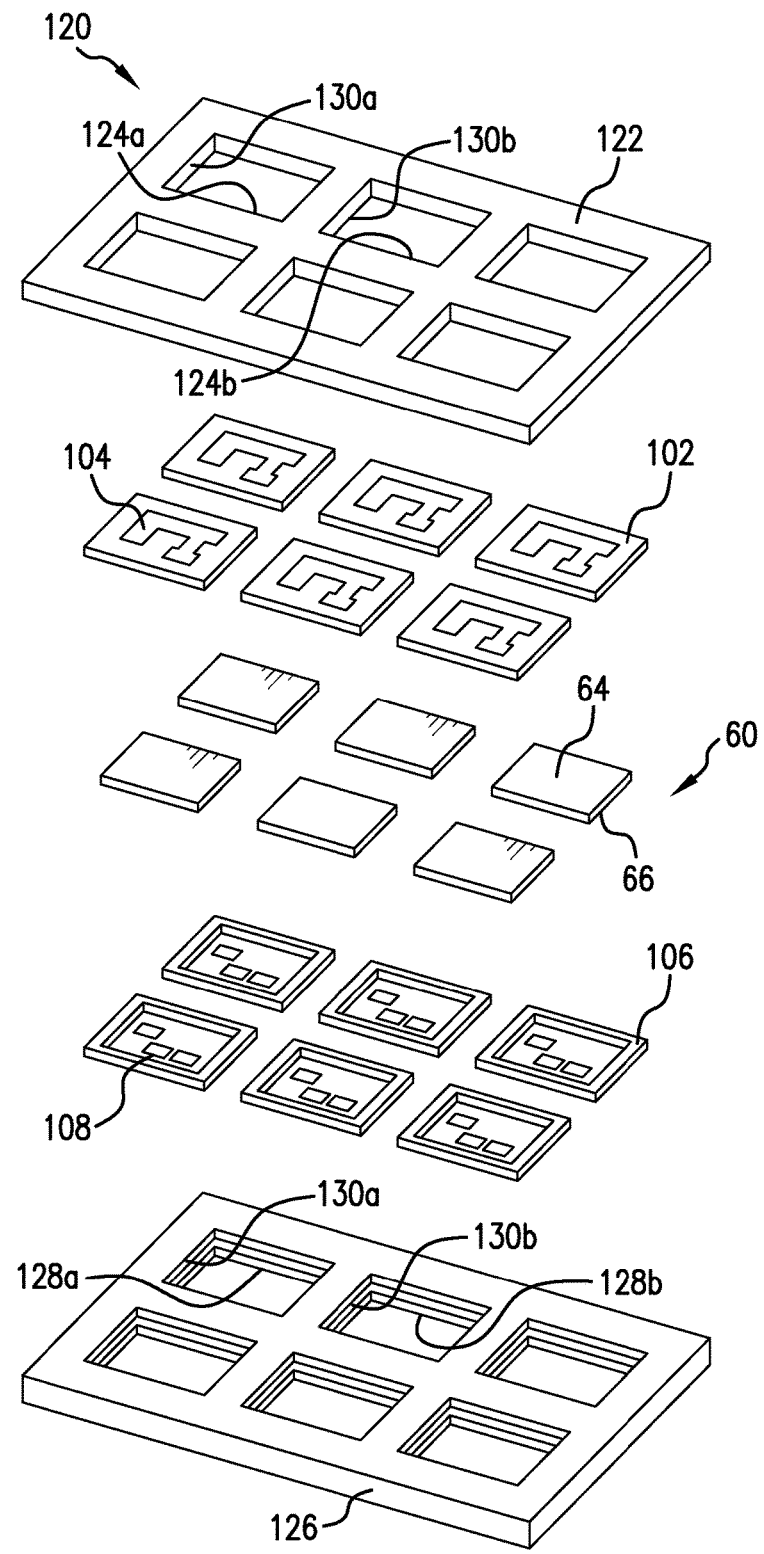
FIG. 6 provides an assembly view another embodiment of a fixture that may be used in dry ice blasting processes, including those carried out by various embodiments of dry ice blasting systems, the embodiment of fixture depicted by FIG. 5 being configured to receive and organize a plurality of templates.

Turning now to FIG. 6, an embodiment of a fixture 120 is depicted. Fixture 120 provides a plurality of receptacles 130a, 130b, etc., for receiving a plurality of substrates 60 and, optionally, for receiving a plurality of substrate 60-template 100 assemblies (see, e.g., FIGS. 4A-C). In some embodiments, the fixture 120 includes a pair of elements 122 and 126 that, together, define the plurality of receptacles 130a, 130b, etc., each of which is configured to receive a substrate 60 and/or a substrate 60-template 100 assembly.

The elements 122 and 126 of a fixture 120 may be made from any suitable metal. Without limitation, metal (e.g., aluminum, stainless steel or steel), a resin and/or a rigid thermoplastic material may be used to form the elements 122 and 126 of the fixture 120.

In some embodiments, such as those depicted by FIG. 6, each receptacle 130a, 130b may be associated with a one or more exposure apertures 124a and 128a, 124b and 128b, etc., with dimensions that may expose a majority of a corresponding side of a substrate 60 assembled with that receptacle 130a, 130b. Such an embodiment of fixture 120 may be configured for use with separate templates 100 (FIGS. 4A-4C) that, in turn, are configured to be positioned adjacent to at least one side 64, 66 of a substrate 60. More specifically, each receptacle 130a, 130b of the fixture 120 may be configured to receive a template 100. Even more specifically, each receptacle 130a, 130b of the fixture 120 may be configured to receive any of a variety of templates 100 with standardized outer dimensions. Such a configuration may enable different templates 100 that are configured for use with different substrates 60 (including, but not limited to, substrates 60 with different shapes and/or dimensions) to be used with a single fixture 120. Such a configuration may also enable templates 100 with different arrangements of apertures 104, 108 (FIGS. 4A-4C) to be used with the same fixture 120.

When the elements 122 and 126 of a fixture 120 are assembled with one another, they may be secured to each other in any suitable manner. Without limitation, corresponding features of the elements 122 and 126 may engage each other (e.g., in an interference fit or a snap fit). Alternatively, the elements 122 and 126 may be secured to one another with suitable coupling elements, such as clamps, bolts (and, optionally, nuts) and the like.

In embodiments where a fixture 120 is configured to hold substrates 60 that have been assembled with complementary templates 100 (FIGS. 4A-4C), as the elements 122 and 126 of the fixture 120 are assembled with one another and secured in the assembled relationship, seals on the inner surfaces 105 and 109 (FIGS. 4A-4C) of the elements 102 and 106 (FIGS. 4A-4C) of the template 100 may be forced against adjacent sides 64 and 66 (FIG. 4A), respectively, of the substrate 60, forming a tight seal against the sides 64 and 66 of the substrate 60.

Although the preceding disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A method for removing material from a substrate, comprising:
   forming a seal of a first element of a template against a first side of substrate, the first element comprising at least one exposure aperture for exposing at least a portion of the first side of the substrate;
   forming a second seal of a second element of the template a second side of the substrate, the second element comprising a second exposure aperture for exposing at least a portion of the second side of the substrate, wherein the first side is opposite the second side;
   securing the first element to the second element with the substrate in between the first element and the second element;
   positioning the template relative to a platen or a support plate of a material removal system; and
   removing a parylene coating from the substrate through the at least one aperture and the second exposure aperture of the template using the material removal system.

2. The method of claim 1, wherein the method further comprises:
   assembling together the template and a plurality of templates, each of the plurality of templates sealed against a respective substrate, with a fixture, wherein positioning the template relative to the platen or the support plate of the material removal system comprises positioning the fixture relative to the platen or the support plate of the material removal system.

3. The method of claim 1, wherein removing the parylene coating from the substrate comprises directing thy ice under pressure into the at least one aperture of the template.

* * * * *